United States Patent [19]

Nagano

[11] Patent Number: 5,665,983
[45] Date of Patent: Sep. 9, 1997

[54] PHOTOCOUPLER DEVICE HAVING LIGHT EMITTING DEVICE AND PHOTO DETECTOR

[75] Inventor: Hiroki Nagano, Tokyo, Japan

[73] Assignee: NEC Corporation, Tokyo, Japan

[21] Appl. No.: 524,769

[22] Filed: Sep. 7, 1995

[30] Foreign Application Priority Data

Sep. 8, 1994 [JP] Japan ..................... 6-214541

[51] Int. Cl.⁶ ................................. H01L 27/15
[52] U.S. Cl. ................... 257/81; 257/82; 257/98; 257/99; 257/100
[58] Field of Search ................. 257/80, 81, 82, 257/98, 99, 100

[56] References Cited

U.S. PATENT DOCUMENTS

4,780,752  10/1988  Angerstein et al. ............... 257/81

FOREIGN PATENT DOCUMENTS

| 55-154785 | 12/1980 | Japan . |
| 59-98565 | 6/1984 | Japan . |
| 61-296776 | 12/1986 | Japan . |
| 62-81072 | 4/1987 | Japan . |
| 63-27067 | 2/1988 | Japan . |
| 63-27069 | 2/1988 | Japan . |
| 63-245968 | 10/1988 | Japan . |
| 1-78056 | 5/1989 | Japan . |
| 2-9181 | 1/1990 | Japan . |
| 2-73208 | 3/1990 | Japan . |
| 4-34985 | 2/1992 | Japan . |

*Primary Examiner*—Minh-Loan Tran
*Attorney, Agent, or Firm*—Foley & Lardner

[57] ABSTRACT

It is an object of the present invention to provide a photocoupler which maintains a high electric isolation performance and has an improved optical coupling efficiency without any variation of a conventional structure and a conventional production process. The photocoupler includes a light emitting device 1 and a photo detector 2 disposed in a facing relationship to each other, a silicon resin 4 covering over the light emitting device 1, a light transmitting resin 5 molding the silicon resin 4 which covers over the light emitting device 1 and the photo detector 2, and a light shielding resin 6 molding the light transmitting resin 5. In the photocoupler, a light scattering material is mixed in the silicon resin 4 which covers over the light emitting device 1. The amount of light scattering material mixed in the silicon resin 4 can be selected from 0.1 to 5.0 percentage by weight of the amount of the silicon resin 4. Further, the silicon resin 4 can be shaped so that the face facing the photo detector 2 is concave.

5 Claims, 6 Drawing Sheets

PHOTOCOUPLER DEVICE HAVING LIGHT EMITTING DEVICE AND PHOTO DETECTOR

BACKGROUND OF THE INVENTION

1. Field of the Invention

The present invention relates to a photocoupler, and more particularly to a photocoupler wherein a light emitting device and a photo detector are disposed in a facing relationship to each other.

2. Description of the Related Art

FIG. 1 is a cross-sectional view of a photocoupler in a first example of the prior art. As shown in FIG. 1, a light emitting device 1 and a photo detector 2 are mounted on a single lead frame 3, and a light transmitting silicon resin 7 covers over the light emitting device 1 and the photo detector 2. Then, in order to avoid influence of disturbance light, a light shielding resin 6 encloses (hereinafter referred to as molds) the light emitting device 1, the photo detector 2, the lead frame 3 and the silicon resin 7. For the light shielding resin 6, a resin of a non-black color (cream color or the like) is in most cases employed so as to reflect much of the light emitted from the light emitting device 1. In the first example of the prior art, since the lead frame 3 is constituted by a single frame and the light emitting device 1 and the photo detector 2 are disposed on the same plane, the photocoupler can be produced readily. Since the structure of the photocoupler makes use of reflected light, it is advantageous in that it has a high optical coupling efficiency.

FIG. 2 is a cross-sectional view of a photocoupler in a second example of the prior art. As shown in FIG. 2, a light emitting device 1 is mounted on a lead frame 3a, and a photo detector 2 is mounted on another lead frame 3b. The lead frames 3a and 3b are disposed such that the light emitting device 1 and the photo detector 2 are faced each other. A light transmitting resin 5 molds the light emitting device 1, the photo detector 2, and the lead frames 3a and 3b. A light shielding resin 6 molds the light transmitting resin 5. Also, in order to moderate the stress coming from the light transmitting resin 5, a transparent silicon resin 7 covers over the light emitting device 1. In the second example of the prior art, epoxy resins are generally employed for the light transmitting resin 5 and the light shielding resin 6. By adding filler into the epoxy resins, the thermal expansion coefficients of the light transmitting resin 5 and the light shielding resin 6 can be made equal. Accordingly, even if thermal hysteresis is applied to the product in the production process or upon mounting, the light transmitting resin 5 and the light shielding resin 6 do not exfoliate from each other along their interface, and therefore, the photocoupler of the second example of the prior art is advantageous in that it can resist high voltage for isolation and accordingly it is a high performance electrical isolator.

FIG. 3 is a cross-sectional view of a photocoupler disclosed in Japanese Utility Model Laid-open No. 27067/88. The structure shown in FIG. 3 is substantially the same as that shown in FIG. 1 except for the light transmitting silicon resin 7. Since corresponding devices in FIGS. 1 and 3 are designated by identical reference numerals, overlapping description is omitted herein.

Referring to FIG. 3, in place of the light transmitting silicon resin 7 shown in FIG. 1, a silicon resin 4, in which a light scattering material is contained, covers over a light emitting device 1 and a photo detector 2. Therefore, the structure shown in FIG. 3 has an improved optical coupling efficiency compared with the structure shown in FIG. 1.

FIG. 4 is a cross-sectional view of a photocoupler disclosed in Japanese Utility Model Laid-open No. 78056/89. The structure shown in FIG. 4 is substantially the same as that shown in FIG. 2 except for the silicon resin 7. Since corresponding devices in FIGS. 2 and 4 are designated by identical reference numerals, overlapping description is omitted herein.

In FIG. 4, differing from FIG. 2, a light emitting device 1 is not covered with the silicon resin 7. Then, a cylindrical lens 8 is disposed between the light emitting device 1 and a photo detector 2, which are disposed in a facing relationship to each other, so that a great amount of light emitted from the light remitting device 1 may be condensed into the photo detector 2. Therefore, the structure shown in FIG. 4 has an improved optical coupling efficiency compared with the structure shown in FIG. 2.

FIG. 5 is a cross-sectional view of a photocoupler disclosed in Japanese Patent Laid-open No. 34985/92. In FIG. 5, a light emitting device 1 and a photo detector 2 are disposed in a horizontally facing relationship to each other, and the light emitting device 1 and the photo detector 2 are each covered with a silicon resin 7. A light transmitting resin 5 covers over the area between and around the silicon resin 7 which covers over the light emitting device 1 and the photo detector 2. Then, a light shielding resin 6 molds the light emitting device 1, the photo detector 2, lead frames 3a and 3b, the silicon resin 7 and the light transmitting resin 5.

In FIG. 5, the silicon resin 7 which covers over the light emitting device 1 and the silicon resin 7 which covers over the photo detector 2 serve as convex lenses respectively. Therefore, the structure shown in FIG. 5 has an improved optical coupling efficiency compared with the structure shown in FIG. 2.

With regard to the structures shown in FIGS. 1 and 3, although the optical coupling efficiency is high, since the thermal expansion coefficient it different between the silicon resin 7 or the silicon resin 4 and the light shielding resin 6, the adhesion along the phase boundary between them is weak, so that a dielectric breakdown is very likely to occur there. Therefore, the structures shown in FIGS. 1 and 3 are disadvantageous in that they resist low voltage for isolation and exhibit an insufficient electric isolation performance.

On the other hand, with the structure shown in FIG. 2, although the electric isolation voltage is high, since only the direct light of the light emitted from the light emitting device 1 reaches the photo detector 2, the structure shown in FIG. 2 is disadvantageous in that it decreases optical coupling efficiency.

The structure shown in FIG. 4, directed to solution of the problem described above, has another problem, however, in that it is difficult to attach the cylindrical lens 8 inside the light transmitting resin 5. Also, the structure shown in FIG. 5 has a further problem in that it is difficult to cover over the light emitting device 1 and the photo detector 2 with the silicon resin 7 in the form of lenses. Both of the structures shown in FIGS. 4 and 5 have problems in that the production process is complicated.

SUMMARY OF THE INVENTION

In view of these facts, an object of the present invention is to provide a photocoupler which maintains a high electric isolation performance and has an improved optical coupling efficiency.

To achieve the above object, the photocoupler of the present invention includes: a light emitting device and a photo detector disposed in a facing relationship to each other; a transparent resin which covers over the light emitting device; a light transmitting resin which molds the transparent resin and the photo detector, the transparent resin covering over the light emitting device; and a light shielding resin which molds the light transmitting resin; wherein a light scattering material is mixed in the transparent resin which covers over the light emitting device.

Here, the transparent resin can be a silicon resin.

In the above-described photocoupler of the present invention, the amount of light scattering material mixed in the silicon resin can be from 0.1 to 5.0 percentage by weight of the amount of silicon resin.

Further, in the above-described photocoupler of the present invention, the silicon resin can be shaped so that the face facing the photo detector is concave.

In the photocoupler of the present invention having the construction described above, since the light emitting device of the photocoupler which has the structurally high electric isolation performance is covered with the silicon resin in which the light scattering material is mixed, light emitted laterally from side faces and the like of a light emitting device and does not reach a photo detector in conventional photocouplers, can be received as scattered light by the photo detector.

Further, by selecting the amount of light scattering material to be mixed from 0.1 to 5.0 percentage by weight of the amount of silicon resin, the total amount of scattered light and direct light coming from the light emitting device to the photo detector can be increased compared with the amount of light reaching conventional photocoupler. Therefore, the optical coupling efficiency can be increased by approximately 1.2 times that of conventional photocoupler without varying the structure and the production process of the conventional photocoupler.

Furthermore, by shaping the silicon resin in which the light scattering material is mixed so that the face facing the photo detector is concave, the ratio of the scattered light is increased, and light emitted from the light emitting device can be received in a greater amount by the photo detector. Therefore, the optical coupling efficiency can be increased by approximately 1.5 times that of the conventional photocoupler.

As described above, the optical coupling efficiency can be improved while maintaining the electric isolation performance without varying the structure and the production process of the conventional photocoupler.

Therefore, the photocoupler of the present invention can drive a current similar to that of the conventional photocoupler with an amount of emitted light smaller than that of the conventional photocoupler, and higher optical transmission speed than ever can be achieved with an amount of emitted light similar to that of the conventional photocoupler.

The above and other objects, features, and advantages of the present invention will become apparent from the following description based on the accompanying drawings which illustrate examples of preferred embodiments of the present invention.

DETAILED DESCRIPTION OF THE PREFERRED EMBODIMENTS

The two embodiments of the present invention will be described with reference to the accompanying drawings.

Figure 1:
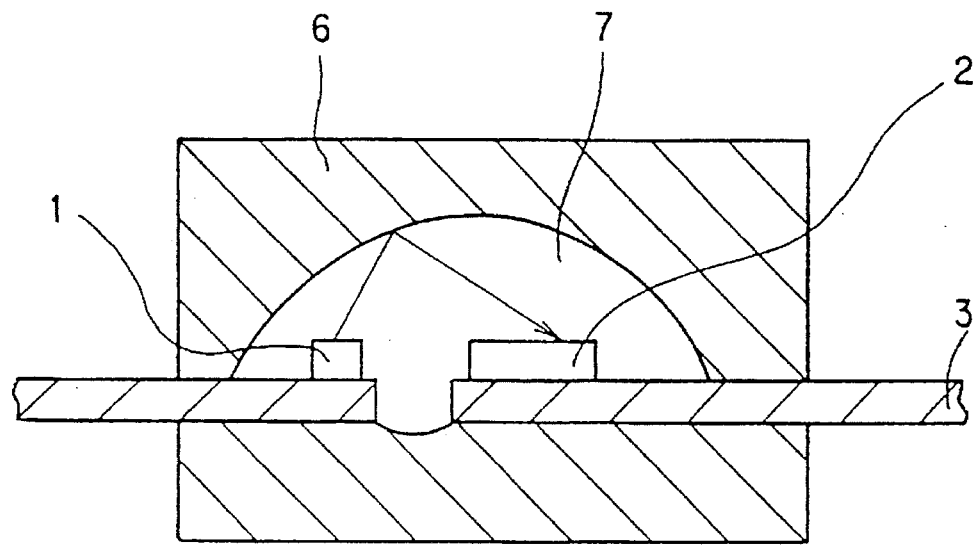
FIG. 1 cross-sectional view of a photocoupler in a first prior art example.
Figure 2:
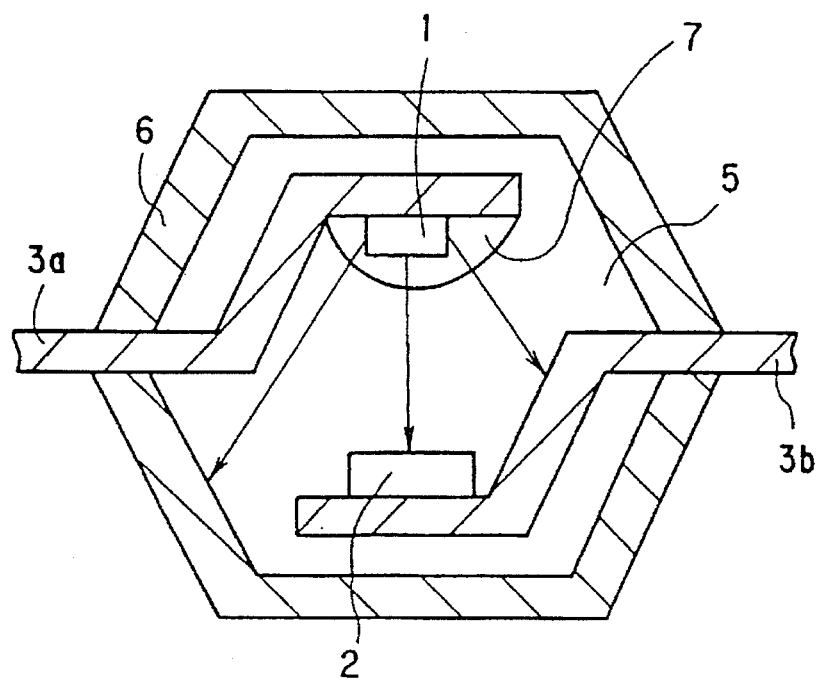
FIG. 2 is a cross-sectional view of a photocoupler in a second prior art example.
Figure 3:
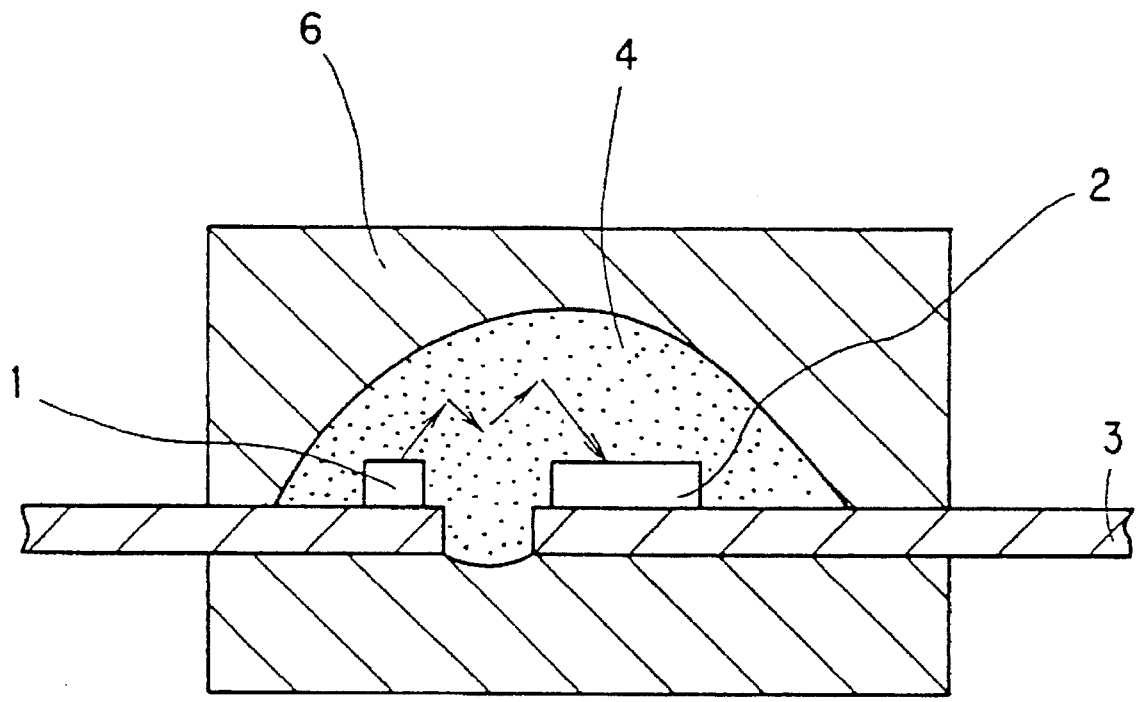
FIG. 3 is a cross-sectional view of a photocoupler disclosed in Japanese Utility Model Laid-open No. 27067/88.
Figure 4:
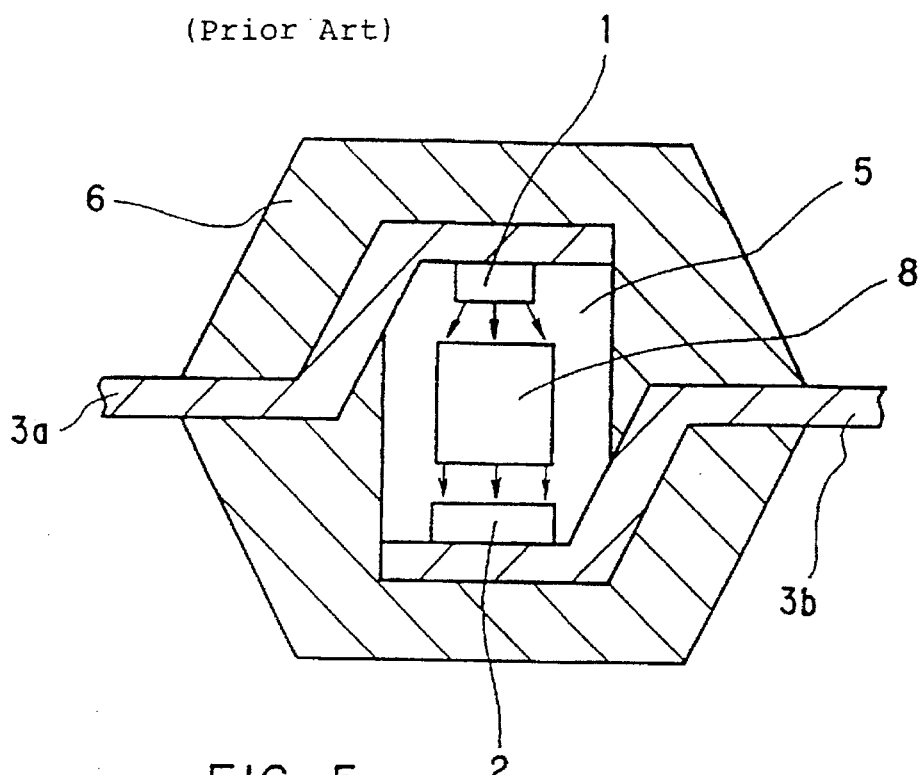
FIG. 4 is a cross-sectional view of a photocoupler disclosed in Japanese Utility Model Laid-open No. 78056/89.
Figure 5:
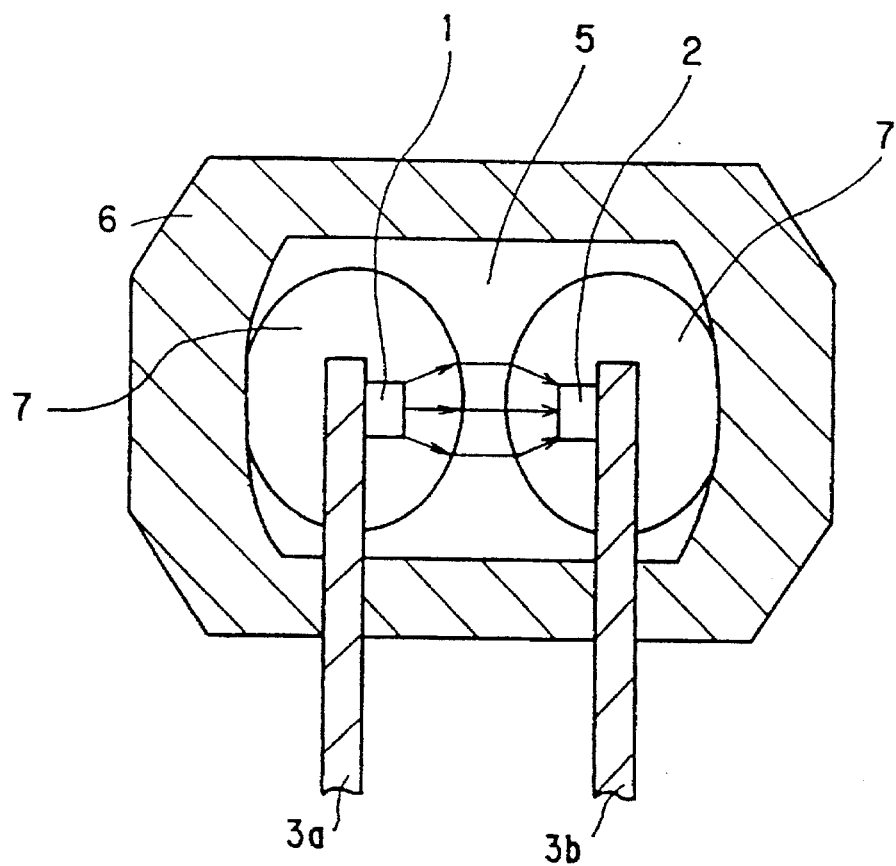
FIG. 5 is a cross-sectional view of a photocoupler disclosed in Japanese Patent Laid-open No. 34985/92.
Figure 6:
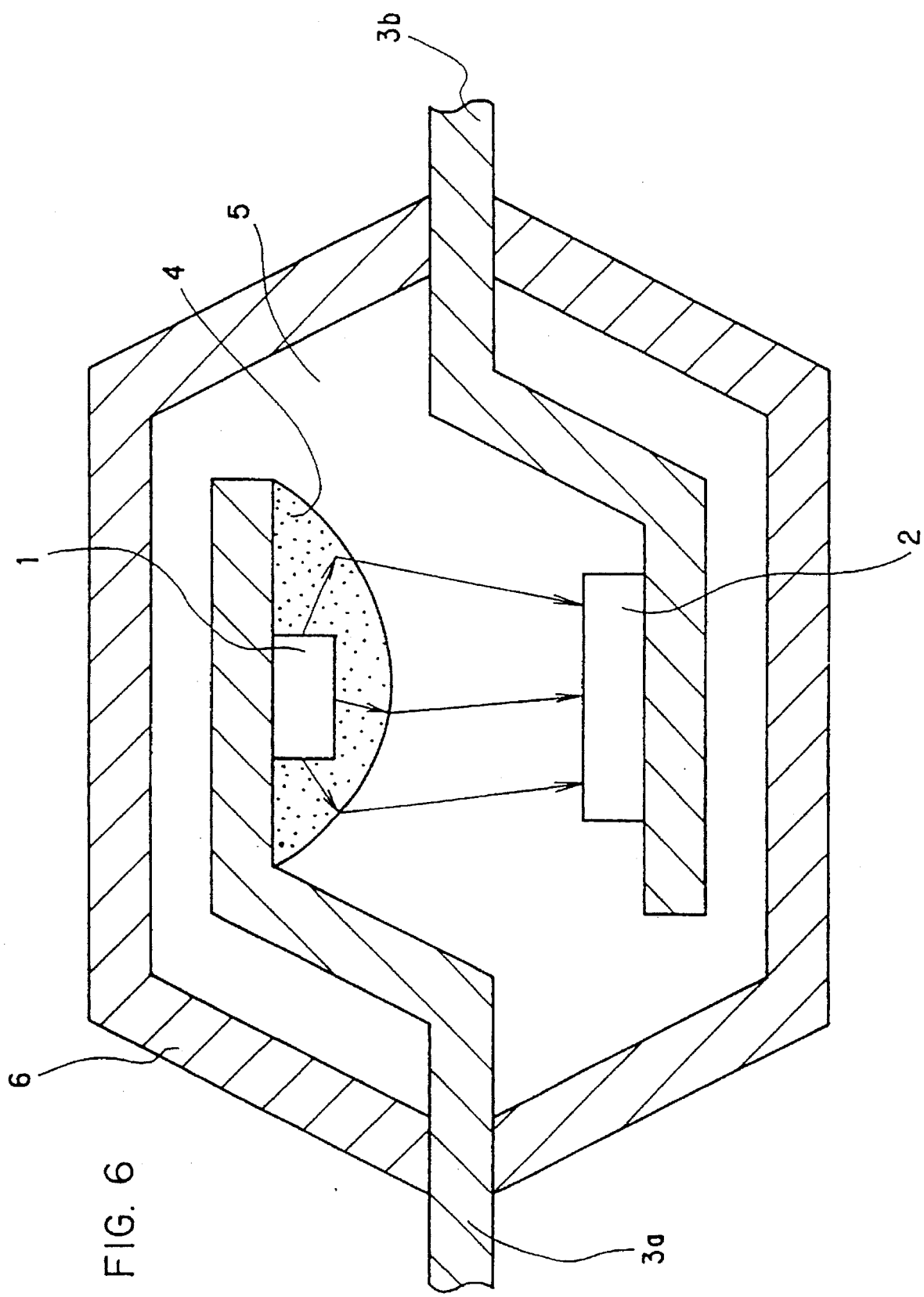
FIG. 6 is a cross-sectional view of a photocoupler in a first embodiment of the present invention.

FIG. 6 is a cross-sectional view of a photocoupler in a first embodiment of the present invention. As shown in FIG. 6, a light emitting device 1 is mounted on a lead frame 3a, and a photo detector 2 is mounted on a lead frame 3b. Thereafter, although not shown in FIG. 6, necessary wire bonding is carried out on the lead frames 3a and 3b. Then, the light emitting device 1 is covered with a silicon resin 4 in which a light scattering material such as $TiO_2$ or $SiO_2$ or the like is mixed from 0.1 to 5.0 percentage by weight. Thereafter, a light transmitting resin 5 molds so as to cover over the silicon resin 4 which covers over the light emitting device 1, the photo detector 2 and the lead frames 3a and 3b. Further, in order to prevent malfunctions by disturbance light, a light shielding resin 6 molds the light transmitting resin 5.

According to the structure shown in FIG. 6, since light emitted from the light emitting device 1 is scattered in the silicon resin 4, part of light emitted in lateral directions from side faces and the like of the light emitting device 1 makes scattered light, and this scattered light reaches the photo detector 2. While direct light emitted from the light emitting device 1 and reaching directly to the photo detector 2 decreases compared with that in cases where no light scattering material is mixed in the silicon resin, the total amount of received light, which is the sum total of the direct light and the scattered light, increases.

Figure 7:
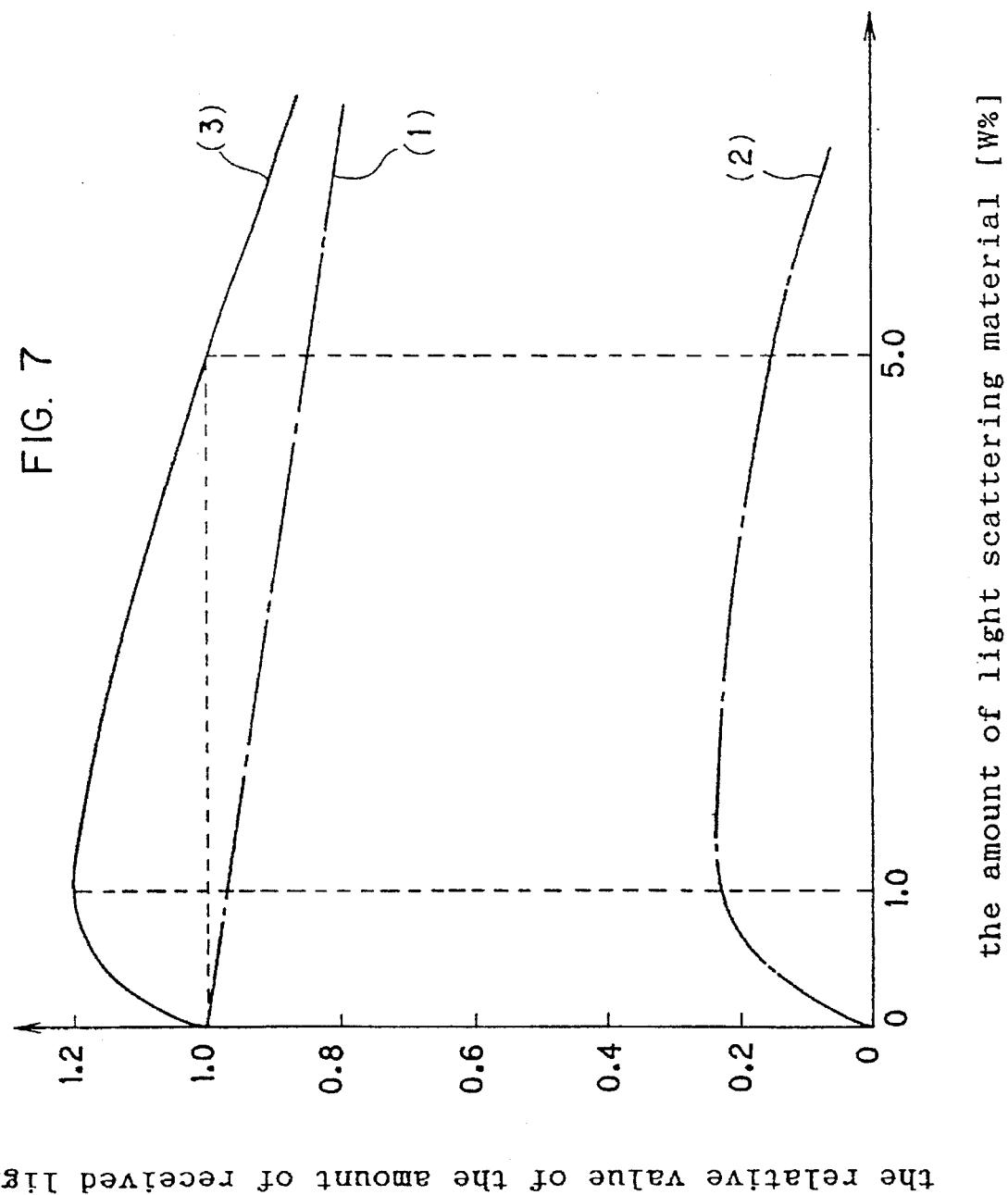
FIG. 7 is a diagram illustrating the relative value of the amount of received light to the amount of light scattering material in the first embodiment.

FIG. 7 is a diagram showing the relative value of the amount of received light to the amount of light scattering material in the first embodiment and illustrates a light receiving state of the photocoupler shown in FIG. 6. Referring to FIG. 7, the lateral axis represents the amount of light scattering material mixed in the silicon resin 4, and the vertical axis represents the relative value of the amount of received light. While the amount of received light (1) of the direct light decreases as a result of addition of the light scattering material, since the amount of received light (2) of the scattered light increases, the total amount of received light (3), which is the sum of (1) and (2), increases. As shown in FIG. 7, the optical coupling efficiency increases by selecting the amount of light scattering material to be mixed from 0.1 to 5.0 percentage by weight of the silicon resin 4. Particularly, when the amount of light scattering material is selected at the optimum amount in the proximity of 1.0 percentage by weight of the silicon resin 4, an optical coupling efficiency of approximately 1.2. times that compared with the silicon resin in which no light scattering material is added is obtained.

Figure 8:
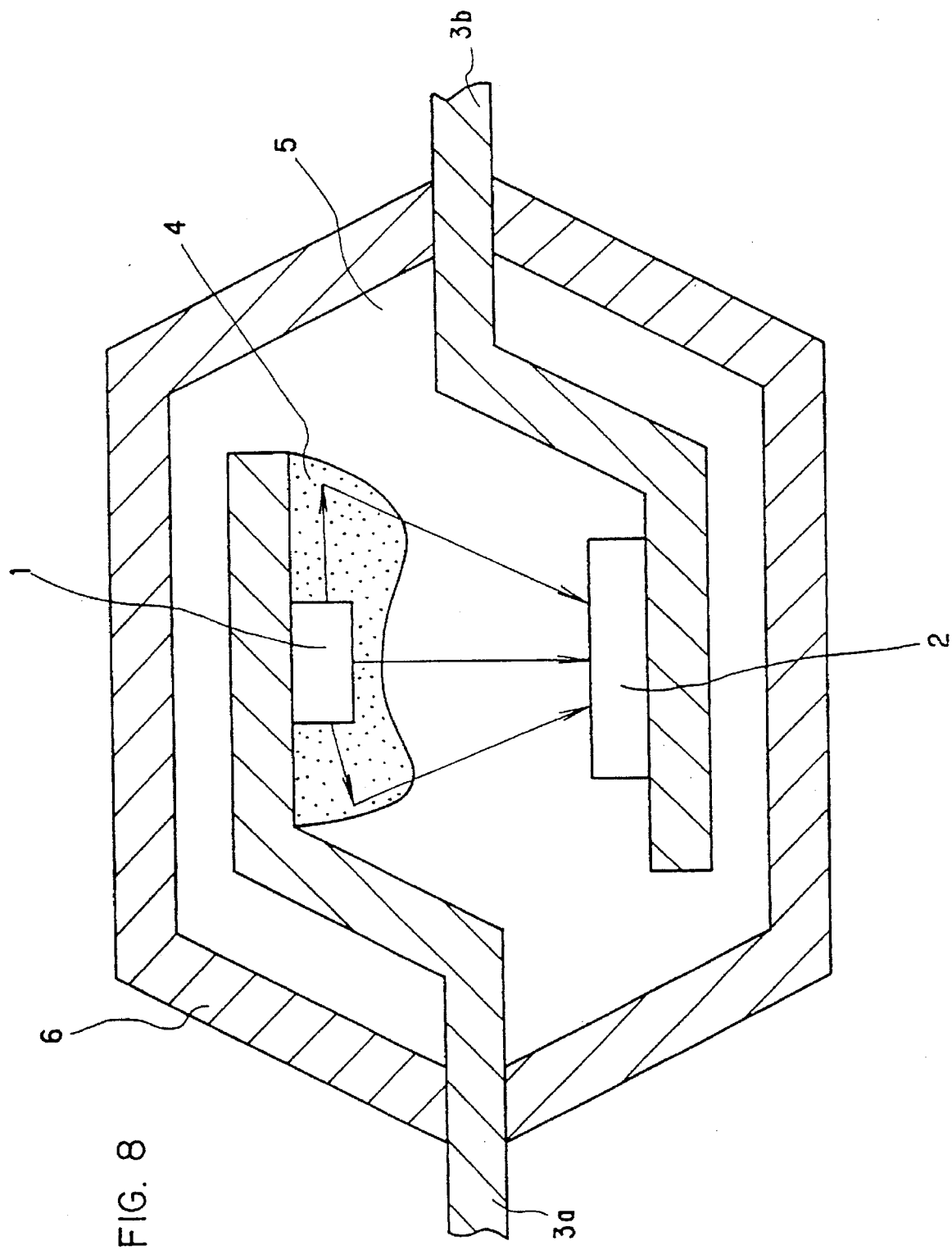
FIG. 8 is a cross-sectional view of a photocoupler in a second embodiment of the present invention.

FIG. 8 is a cross-sectional view of a photocoupler in a second embodiment of the present invention. The structure shown in FIG. 8 is substantially the same as that shown in FIG. 6 except for the shape of silicon resin 4. Since corresponding devices of FIGS. 6 and 8 are designated by identical reference numerals, over-lapping description is omitted herein.

In the second embodiment shown in FIG. 8, in order to improve further the effect of the first embodiment shown in FIG. 6, the shape of silicon resin 4 selected is concave so as to increase its light scattering effect. Therefore, in the second embodiment, although not shown in FIG. 8, an optical coupling efficiency of approximately 1.5 times that of the silicon resin in which no light scattering material is added is obtained.

In the embodiments described above, silicon resin is employed for covering the light emitting device. However, other appropriate transparent resins can be used in lieu of the silicon resin.

It is to be understood that although the characteristics and advantages of the present invention have been set forth in the foregoing description, the disclosure is illustrative only, and changes may be made in the shape and arrangement of the parts within the scope of the appended claims.

What is claimed is:

1. A photocoupler comprising:

a light emitting device and a photo detector disposed in a facing relationship to each other;

a transparent resin which covers over said light emitting device;

a light transmitting resin which molds said transparent resin and said photo detector; and a light shielding resin which molds said light transmitting resin;

light scattering material being mixed in said transparent resin which covers over said light emitting device, and said light scattering material being absent from said light transmitting resin.

2. A photocoupler according to claim 1, wherein said transparent resin is a silicon resin.

3. A photocoupler according to claim 2, wherein the amount of said light scattering material mixed in said silicon resin is from 0.1 to 5.0 percentage by weight of the amount of said silicon resin.

4. A photocoupler comprising: a light emitting device and a photo detector disposed in a facing relationship to each other; a transparent resin which covers over said light emitting device; a light transmitting resin which molds said transparent resin and said photo detector; and a light shielding resin which molds said light transmitting resin;

light scattering material being mixed in said transparent resin which covers over said light emitting device, and said light scattering material being absent from said light transmitting resin, said transparent resin being shaped so that the face facing said photo detector is concave.

5. A photocoupler comprising: a light emitting device and a photo detector disposed in a facing relationship to each other; a transparent resin which covers over said light emitting device; a light transmitting resin which molds said transparent resin and said photo detector; and a light shielding resin which molds said light transmitting resin; light scattering material being mixed in said transparent resin which covers over said light emitting device, said transparent resin being a silicon resin, the amount of said light scattering material mixed in said silicon resin being from 0.1 to 5.0 percentage by weight of the amount of said silicon resin, and said silicon resin being shaped so that the face facing said photo detector is concave.

* * * * *